United States Patent [19]
Watanabe

[11] Patent Number: 5,608,740
[45] Date of Patent: Mar. 4, 1997

[54] ERROR CORRECTING METHOD

[75] Inventor: Takashi Watanabe, Kanagawa, Japan

[73] Assignee: Sony Corporation, Tokyo, Japan

[21] Appl. No.: 518,857

[22] Filed: Aug. 24, 1995

Related U.S. Application Data

[63] Continuation of Ser. No. 174,391, Dec. 28, 1993, abandoned.

[30] Foreign Application Priority Data

Dec. 30, 1992 [JP] Japan ..................... 4-360801

[51] Int. Cl.⁶ ............................... H03M 13/00
[52] U.S. Cl. .............. 371/37.4; 371/37.1; 371/37.7
[58] Field of Search ..................... 371/37.1, 37.4, 371/38.1, 39.1, 31, 37.5, 37.7

[56] References Cited

U.S. PATENT DOCUMENTS

| | | | |
|---|---|---|---|
| 4,400,810 | 8/1983 | Ive | 371/40 |
| 4,606,026 | 8/1986 | Baggen | 371/39.1 |
| 4,637,021 | 1/1987 | Shenton | 371/37.1 |
| 4,829,525 | 5/1989 | Sugiyama et al. | 371/37.7 |
| 5,142,537 | 8/1992 | Kutner et al. | 371/31 |
| 5,477,276 | 12/1995 | Oguro | 348/595 |

*Primary Examiner*—Roy N. Envall, Jr.
*Assistant Examiner*—Thomas E. Brown
*Attorney, Agent, or Firm*—Jay H. Maioli

[57] ABSTRACT

An error correcting method, when a parity code is used to decode added data, that drastically reduces the probability of erroneous correction due to erasure correcting. When coded data, to which has been added a parity code, is decoded, errors up to half of a predetermined number of words of the parity code are word-corrected, and errors up to the predetermined number of words of the parity code are erasure-corrected.

4 Claims, 12 Drawing Sheets

ERROR CORRECTING METHOD

This is a continuation of application Ser. No. 08/174,391 filed Dec. 28,1993, now abandoned.

BACKGROUND OF THE INVENTION

1. Field of the Invention

The present invention relates to an error correcting method, and more particularly, is applicable to reproducing systems of data recorders.

2. Description of the Related Art

As a conventional recording and/or reproducing apparatus for high-density recording of information data, there is a data recorder which is based upon the ANSI ID-1 format (Third draft PROPOSED AMERICAN NATIONAL STANDARD 19 mm TYPE ID-1 INSTRUMENTATION DIGITAL CASSETTE FORMAT X3B6/88-12 Project 592-D 1988- 03-22).

Such a data recorder processes to error-correction-code the information data by using the Reed-Solomon code in the form of product code, and records it on a magnetic tape, in order to detect and correct transmission errors when reproducing.

A summary of this data recorder will be described as follows. FIG. 1 shows the recording pattern on a magnetic tape 15 of the data recorder based upon the ID1 format. ANN shows an annotation track which records an annotation. TR1, TR2, TR3, ..., show data tracks in which information data are recorded, and in which one sector is formed in each track. In addition, respective data tracks are azimuth-recorded alternately. CTL shows a control track in which control signals are to be recorded, and TC shows a time code track in which the time code is recorded.

Configuration of these data tracks TR1, TR2, TR3, ..., are standardized in common as shown in FIGS. 2A and 2B. That is, one data track TR corresponds to 1 sector SEC, and is composed of a preamble portion PR, a data recording portion DT, and a postamble portion PS. Note that, the preamble portion PR corresponds to the lower tip of the data tracks TR1, TR2, TR3, ..., which are helically formed.

The preamble portion PR is composed of a 20 bytes length of rising sequence RUS, a synchronizing code $SYNC_{PR}$ and a sector discriminating data $ID_{SEC1}$ which are 4 bytes length respectively, and a 6 bytes length of auxiliary data $DT_{AUX}$.

Also, the succeeding data recording portion DT is composed of 256 synchronizing blocks BLK ($BLK_0$, $BLK_1$, $BLK_2$, ..., $BLK_{255}$), and the input information data is recorded in this portion. Each synchronizing block BLK is formed by a parity code RI which is composed of 4 bytes length of block synchronizing code $SYNC_{BLK}$, one byte length of block discriminating data $ID_{BLK}$, 153 bytes length of inner data DI (which is a data inner-coded the input information data), and 8 bytes length of Reed-Solomon code. Also, the succeeding postamble portion PS is composed of a synchronizing code $SYNC_{PS}$ and a sector discriminating data $ID_{SEC2}$ which are each 4bytes in length.

FIG. 3 shows a recording system of the ID-1 format data recorder. In the recording system 1, the input information data is error-correction-coded in the form of product code, and is recorded. A summary of operations of the respective circuits will be described as follows. First, an input information data $DT_{USE}$ 1-byte 8-bit configurating is input to an outer code generating circuit 2.

In this code generating circuit 2, as shown in FIG. 4, with respect to each of the data blocks being in an unit of 118 bytes of the input information data $DT_{USE}$, parity codes $RO_0$ to $RO_{305}$ consisting of 10 bytes of the Reed-Solomon code are generated as the outer code by using a predetermined generating binomial expression, to add it after each of data blocks, and output them as the outer data block DO. The outer data block DO is provided to a memory 4 via a first multiplexer 3.

FIG. 5 shows configuration of the memory 4 and data arrangement in the memory. As shown in FIG. 5, the memory 4 is composed of memories MEM1 and MEM2 that are constructed in columns being 154 bytes and rows being 128 bytes. Outer data blocks for 153 blocks $DO_0$ to $DO_{152}$ input sequentially are written into MEM1, and outer data blocks for 153 blocks $DO_{153}$ to $DO_{305}$ succeeding the outer data blocks $DO_0$ to $DO_{152}$ and input sequentially are written into MEM2, by 1 outer data block column by column respectively. Information data of 1 outer data block is 118 bytes. An information data for 153 blocks are written into the memories MEM1 and MEM2 respectively, that is, information data of 118 ×153×2 bytes, i.e., 36,108 bytes of information data are written into the memory 4.

In each of columns of the memories MEM1 and MEM2, the data is written in order in the A direction of FIG. 5. Ten bytes at the lower side of each column in the memories MEM1 and MEM2 correspond to the outer codes. Also, a data block discriminating data $ID_B$ which discriminates each of lines of the memories MEM1 and MEM2 generated by the discriminating data generating circuit 5, is supplied to the memory 4 via the first multiplexer 3. Of the data block discriminating data $ID_B$, the data for even numbers $ID_{BE}$ is written into the memory MEM1, and the data for odd numbers $ID_{BO}$ is written into the memory MEM2, in one line each and in order in the A direction.

The data written into the memories MEM1 and MEM2 are read, in order in the B direction handling data in one row as one block. Reading a row is executed alternately with respect to the memories MEM1 and MEM2, in the order corresponding to the data block discriminating data $ID_B$ (00, 01, 02, 03, ..., ).

The data read from the memories MEM1 and MEM2 are input to an inner code generating circuit 6. The inner code generating circuit 6 generates parity codes $RI_0$ to $RI_{255}$ consisting of 8 bytes of the Reed-Solomon code for every input data block, by using a predetermined generating binomial expression, and adds it after each of the data blocks, and outputs them to a second multiplexer 7 as inner data blocks $DI_0$ to $DI_{255}$ shown in FIG. 6.

The second multiplexer sequentially selects among a preamble data PR and a postamble data PS which are formed by a preamble portion/postamble portion generating circuit 8, and inner data blocks $DI_0$ to $DI_{255}$ output from the inner code generating circuit 6 and outputs it. These output data are output in the order of the preamble data PR, the inner data blocks $DI_0$ to $DI_{255}$, and the postamble data PS.

The output from the second multiplexer 7 is supplied to a data distributing circuit 9. The data distributing circuit 9 randomizes the input data every 1 byte, by executing exclusive OR operations between a predetermined data. The randomized data are input to an 8-9 modulating circuit 10. The 8-9 modulating circuit 10 converts the 8-bit data configuration into 9-bit data configuration, to remove DC components of the signal waveform recorded on the magnetic tape (DC freeing). A summary of this conversion will be described as follows.

Two kinds of 9-bit data are previously prescribed by the ID-1 format, with respect to each of the values of 1-byte 8-bit input data having 256 kinds of values. Between these two kinds of 9-bit data, the polarities of the CDS (Codeword Digital Sum) are different from each other. The 8-9 modulating circuit watches the DSV (Digital Sum Variation) of 9-bit data output corresponding to the input data, and selects one of the two 9-bit data having different CDS values from each other, so as to converge the values to zero. Thereby, the 1-byte 8-bit configuration input data are converted into a DC free 9-bit configuration data. Note that, the 8-9 modulating circuit 10 also includes a circuit which converts the form of input data of the NRZL (Nonreturn to Zero Level) into that of NRZI (Nonreturn to Zero Inverse).

The output from the 8-9 modulating circuit 10, i.e., the data consisting of 9-bit configuration of the NRZI, is supplied to a third multiplexer 11. The multiplexer 11 adds a fixed 4 bytes length of synchronizing code $SYNC_B$ formed by a synchronizing code generating circuit 12, with respect to each of the data blocks of inner data blocks $DI_0$ to $DI_{255}$. in order to form synchronizing blocks $BLK_0$ to $BLK_{255}$. The code pattern of the synchronizing code $SYNC_B$ is prescribed by the ID-1 format, and it is standardized that the pattern to be recorded on a magnetic tape must be kept in the form of this code pattern.

FIG. 7 shows a data obtained by these processing with map. The output of the third multiplexer 11 is formed as data arrangement obtained by scanning maps MAP1 and MAP2 in the horizontal direction, that is shown in FIGS. 2A and 2B in detail.

The output of the third multiplexer 11 is input to a parallel/serial converting circuit 13. The parallel/serial converting circuit 13 converts respective data of the preamble portion PR, synchronizing blocks $BLK_0$ to $BLK_{255}$, and the postamble portion PS, having input bit parallel configuration into data $S_{REC}$ having bit serial configuration.

The serial data $S_{REC}$ is amplified by a recording amplifying circuit 14, and then supplied to a magnetic head 16 which helically scans onto the magnetic tape 15 a recording signal, in order to form recording tracks TR ( . . . TR1, TR2, TR3, TR4, . . . ,) shown in FIG. 1 on the magnetic tape 15. In such a manner, the recording system of the data recorder 1 can record desired information data $DT_{USE}$ adding the error correcting codes in the form of the Reed-Solomon product codes.

The information data $DT_{USE}$ thus recorded on the magnetic tape 15 by the recording system of the data recorder 1, is reproduced by a reproducing system of the data recorder as shown in FIG. 8. In the signal processing of this reproducing system 20, the process opposite with the recording system 1 is done. That is, in the reproducing system 20 of the data recorder, the recording tracks TR ( . . . TR1, TR2, TR3, TR4, . . . ) on the magnetic tape 15 are read as a reproducing signal SpB by using the magnetic head 16, and these are input to a reproducing amplifying circuit 21.

The reproducing amplifying circuit 21 is comprised of an equalizer and a binarizing circuit etc., in which the input reproducing signal $S_{PB}$ is binarized, to output it as a reproducing digital data $DT_{PB}$ to the succeeding serial/parallel converting circuit 22. The serial/parallel converting circuit 22 converts the reproducing digital data $DT_{PB}$ in serial form into 9-bit parallel data $DT_{PR}$.

A synchronizing code detecting circuit 23 detects the 4 bytes length synchronizing code $SYNC_B$ in the parallel data $DT_{PR}$, to discriminate a synchronizing block based on that. Also, the synchronizing code detecting circuit 23 is comprised of a circuit converting the NRZI form parallel data $DT_{PR}$ into that of NRZL form.

The output of the synchronizing code detecting circuit 23 is supplied to an 8-9 demodulating circuit 24. In the 8-9 demodulating circuit 24, the 9-bit data, that was converted from 8-bit data to DC free data in the recording system, is restored to 8-bit data again. The 8-9demodulating circuit is composed of a ROM (Read Only Memory), and converts the 9-bit data into 8-bit data by tabulation processing.

In a data derandomizing circuit 25, the restored 8-bit data is derandomized, which is the inverse processing from the one executed in the recording system, i.e., randomizing processing. This derandomizing can be achieved by executing the exclusive OR operation between the predetermined data which is the same as the data used in randomizing and the input data of the data derandomizing circuit 25.

An inner code error detecting and correcting circuit 26 error-detects and error-corrects, with respect to the inner data blocks $DI_0$ to $DI_{255}$ within the detected synchronizing blocks, by using 8 bytes length of inner codes $RI_O$ to $RI_{255}$ added to each of the blocks.

The inner-error-corrected inner data blocks $DI_0$ to $DI_{255}$ are written into the memory 28 having the same constitution as the memory of the recording system 4 shown in FIG. 5, in one row for each 1 data block, based on the one byte length discriminating data $ID_B$ which has been added to each of the blocks detected by the discriminating data detecting circuit 27. The sequence of the writing is the same as the sequence of the reading of the memory of the recording system 1, and the data are written into the MEM1 and MEM2 alternately, i.e., in the order of the block discriminating data of each row.

The data written to each of memories MEM1 and MEM2 of the memory 28, are read in the same sequence as the sequence of writing to the memory of the recording system 1 toward the next column, in order to obtain 128 bytes length of outer data blocks $DO_0$ to $DO_{305}$ again. An outer code error detecting and correcting circuit 29 error-detects and error-corrects with respect to the outer data blocks $DO_0$ to $DO_{305}$ output from the memory 28, by using 10 bytes length of outer codes $RO_0$ to $RO_{305}$ added to respective blocks. Thereby, the information data $DT_{USE}$ recorded on the magnetic tape 15 is reproduced.

However, in the reproducing system of the data recorder having the above configuration, by using a parity consisting of an inner code or an outer code added in the reproducing system, errors generated in the tape recording and reproducing systems are corrected. This correction can be obtained by solving the following equation:

$$\begin{aligned} S_0 &= e_1 + e_2 + e_3 \\ S_1 &= x_1 e_1 + x_2 e_2 + x_3 e_3 \\ S_2 &= x_1^2 e_1 + x_2^2 e_2 + x_3^2 e_3 \\ S_3 &= x_1^3 e_1 + x_2^3 e_2 + x_3^3 e_3 \\ S_4 &= x_1^4 e_1 + x_2^4 e_2 + x_3^4 e_3 \\ S_5 &= x_1^5 e_1 + x_2^5 e_2 + x_3^5 e_3 \end{aligned} \quad (1)$$

Here, "S" represents a syndrome, "x" represents an error position, and "e" represents an error value respectively.

A syndrome is a value which includes the position information of a data and a parity and is cumulated and added (EOR). In the case of the equation (1), $S_O$ to $S_5$ are calculated based on the position information to be summed. In word correcting wherein the error position "x" is known, "x" and "e" of the equation (1), are obtained. And in erasure correcting, a gray flag which is added when the word correction of an inner correction is impossible, is used to obtain the error value "e" by setting this flag position as "x".

Accordingly, theoretically in the word correcting, errors up to the word number of half the number of bytes of the added parity can be corrected. In the erasure correcting, errors up to the word number of the number of bytes of the parity can be corrected. And the error correcting can be executed by adding (EOR) the error value "e" to the error position "x" which is obtained by solving equation (1).

Actually, with respect to the data of matrix shown in FIG. 9, the inner error/outer error correcting processing shown in FIG. 10 is executed to execute an error correcting processing. An 8-byte inner parity and a 10-byte outer parity are added as the data at the coding side.

The correcting procedure is started at Step SP0, and at the succeeding step SP1, errors up to 4-words at the inner side are judged to determine whether the word correcting is possible or not. Here, if an affirmative result is obtained, the word correcting is executed at step SP2. If at step SP1, a negative result is obtained, it proceeds to step SP3 to add a gray flag.

In either case, it proceeds to step SP4 in which errors up to 10-words at the outer side are judged whether the erasure correcting is possible or not, and if an affirmative result is obtained, it proceeds to step SP5 to erasure-correct, and then the error correcting processing is terminated at step SP6.

On the contrary, if a negative result is obtained at step SP4, the word correcting up to 5-words are judged whether it is possible or not at step 7. Here, if an affirmative result is obtained, the word correcting is executed at step SP8, and it proceeds to step SP6 to terminate the above error correcting processing SP0. If a negative result is obtained at step SP7, it proceeds directly to step SP6 to terminate the above error correcting processing SP0.

Thereby, in the matrix of FIG. 9, with respect to (1) to (10), (1), (2), (4), (5), and (10) can be corrected as inner correcting IN, since (1) is one word error, and (5) is two words error, (2), (4), and (10) are three words errors. Since (6) and (7) are four words errors, and (3) and (8) are five words errors, these cannot be corrected, therefore, gray flags are added to them. Further, since (9) which is six words error, is misjudged as a three words error, miscorrecting occurs.

Also as an outer correcting OUT, (14), (19), (21), and (23) are 4-erasure-corrected by using the flags, further, because (11) to (13), (15) to (18), (20), and (22) are errors at a position of no flag, these are miscorrected as four erasure correcting.

Note that, in FIG. 9, WD0 represents a correctable word by inner correcting, WD1 is represents an uncorrectable word by the inner correcting but correctable by outer correcting, and WD2 represents a word of gray flag which is added when inner correcting is impossible. Also, WD3 represents a word which is misdetected by the inner correcting and which remains as an error, WD4 represents a word which is miscorrected by the inner correcting and as a result, a new error is generated by it.

Actually, the miscorrecting described above is generated in some probability according to the coding theory. For example, if the parity is 8-bytes, as shown in FIG. 11, the distance between codes is "9", however, it is feared that because a code A is a three words error, a six words error of a code B may be misdetected as a three words error, and be miscorrected.

In this case, when outer correcting, the erasure correcting is executed with priority, as a result, if the erasure correcting is impossible, the word correcting is executed successively. In such a case, there is a problem that the gray flag added by the inner correcting is trusted completely, and when the gray flag is within the correctable number, miscorrection as described above is caused because of the use of the miscorrected flag information.

SUMMARY OF THE INVENTION

In view of the foregoing, an object of the present invention is to provide an error correcting method in which when decoding a data with parity code, the probability of miscorrection by the erasure correcting can be reduced.

The foregoing object and other objects of the present invention have been achieved by the provision of an error correcting method in which, when decoding a data which is added and coded a parity code having error correcting ability up to a predetermined word, errors up to half of a predetermined word number of the data are word corrected (SP15), and errors up to a predetermined word number of the data are erasure corrected (SP18).

Further, a parity code of N bytes is added at the outer side, and a parity code of M bytes is added at the inner side. When decoding data coded in the form of product coding, errors up to half of the word number M are word corrected at the inner side (SP12), and errors up to half of the word number N are corrected at the outer side, while errors up to the word number N (SP18) are erasure-corrected.

Further, the Reed-Solomon code is added as the parity code.

When decoding a data added and coded a parity code, errors up to half of a predetermined word number of the data are word corrected (SP15), and errors up to a predetermined word number of the data are erasure corrected (SP18), in order to reduce the probability of the occurrence of erroneous correction due to erasure correcting.

Further, when decoding a data coded in the form of product coding of N bytes ×M bytes, errors up to half of the word number M are word corrected at the inner side (SP12), and errors up to the word number N are word corrected at the outer side (SP15), while errors up to the word number N are erasure corrected (SP18), in order to reduce the probability of the occurrence of erroneous correction due to erasure correcting.

According to the present invention, when decoding data that has been added a parity code and coded, errors up to half of a predetermined word number of the data are word corrected, and errors up to a predetermined word number of the data are erasure corrected. Thereby, an error correcting method can be realized wherein the probability of the occurrence of erroneous correction due to erasure correcting can be reduced.

Further, when decoding data that has been coded in the form of product coding of N bytes ×M bytes, errors up to half of the word number M are word corrected at the inner side, and errors up to half of the word number N are word corrected at the outer side, while errors up to the word number N are erasure corrected. Thereby, an error correcting method can be realized wherein the probability of the erroneous correction due to erasure correcting can be reduced.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 1:
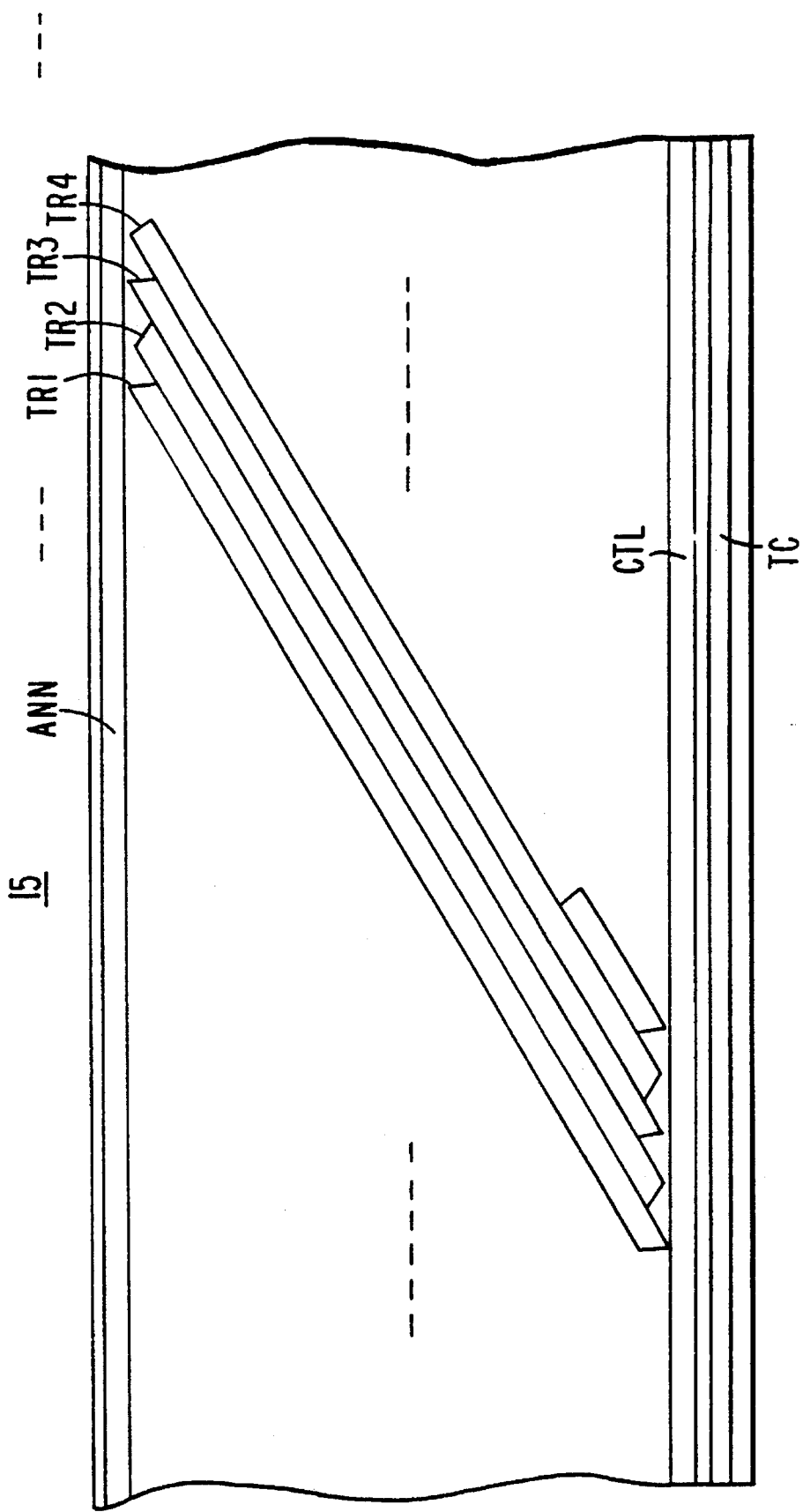
FIG. 1 is a schematic diagram explaining the ID-1 format recording pattern.
Figures 2A, 2B:
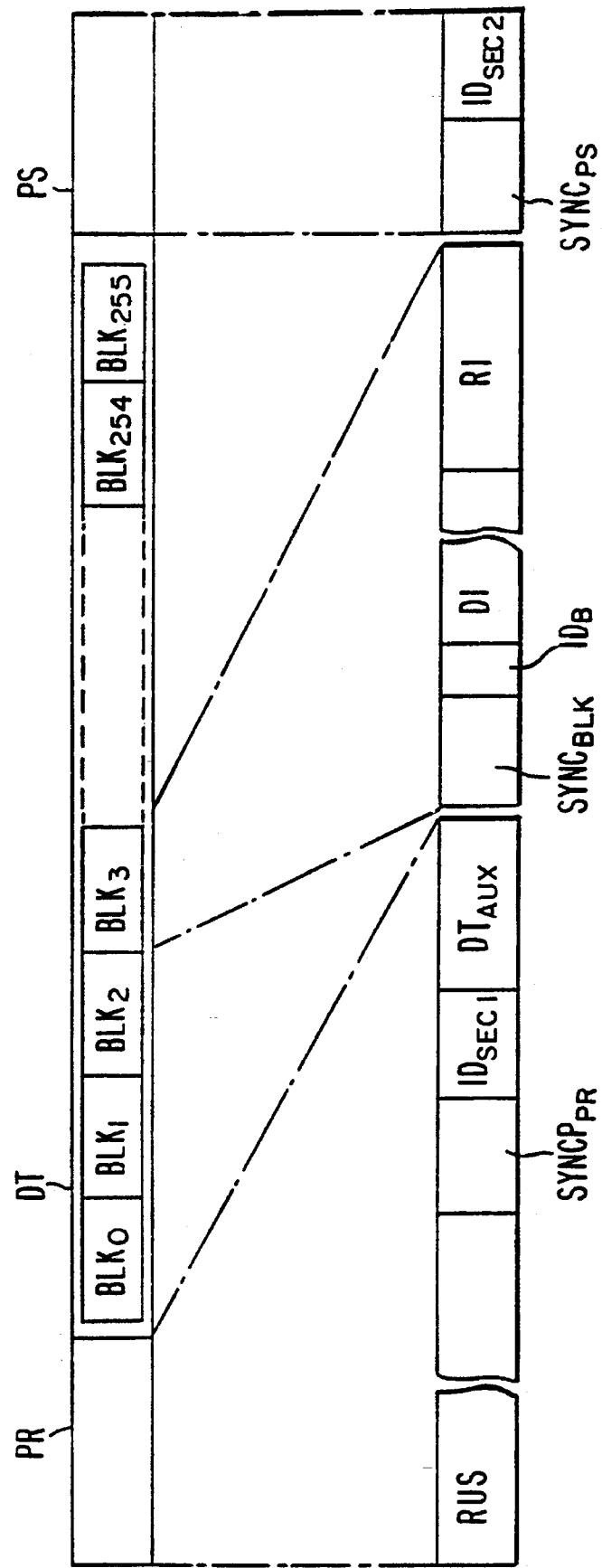
FIGS. 2A and 2B are schematic diagrams showing the contents of a data track in the ID-1 format.
Figure 3:
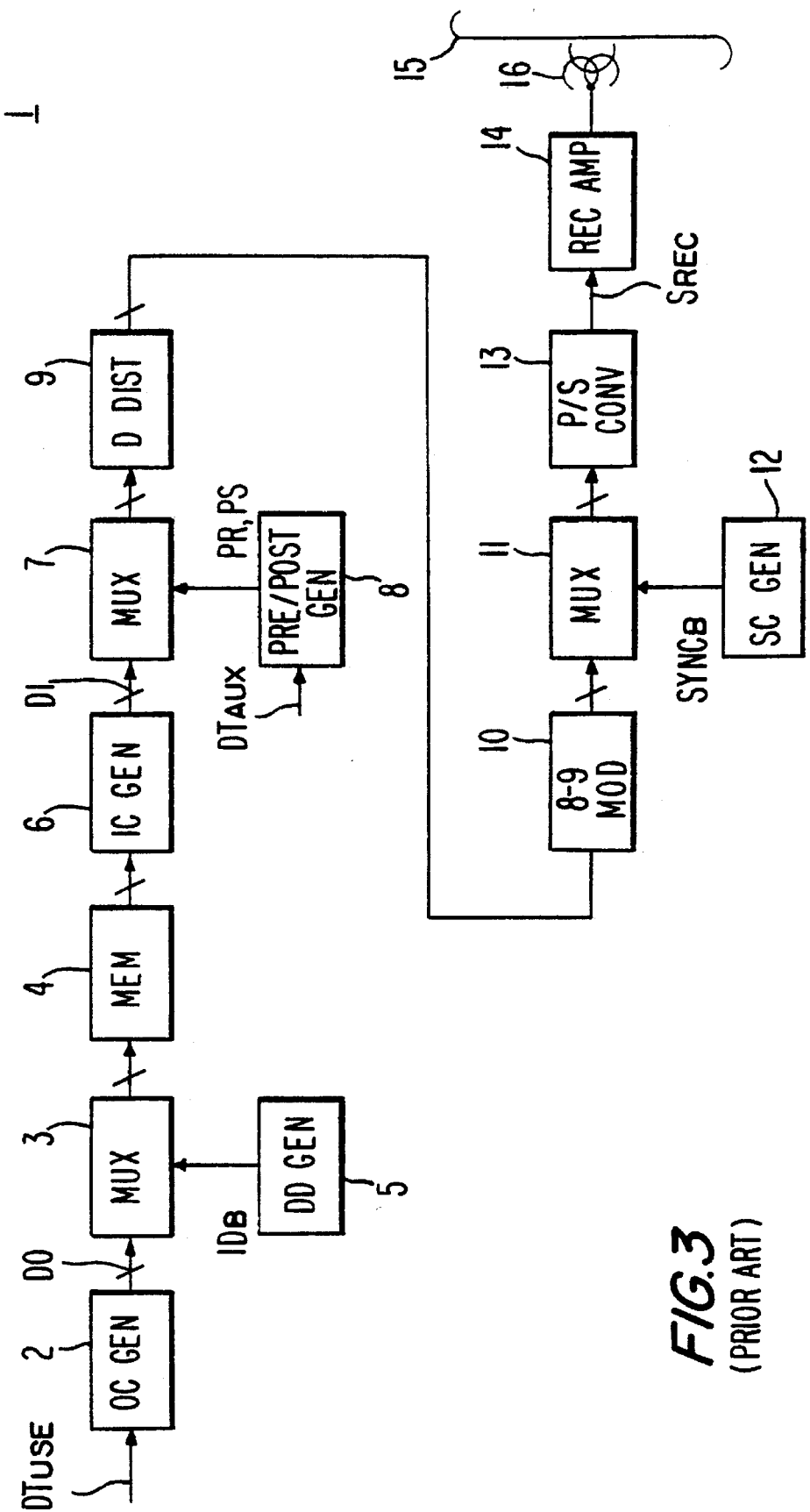
FIG. 3 is a block diagram showing a recording system of the ID-1 format data recorder.
Figure 4:
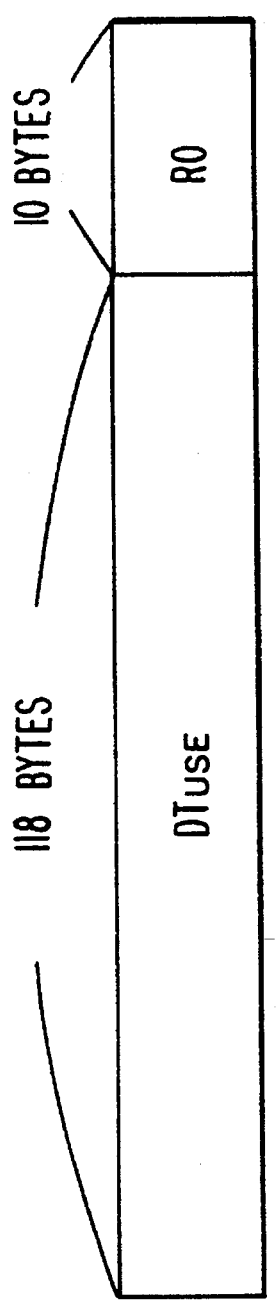
FIG. 4 is a schematic diagram showing an outer data block in the recording system of the data recorder.
Figure 6:
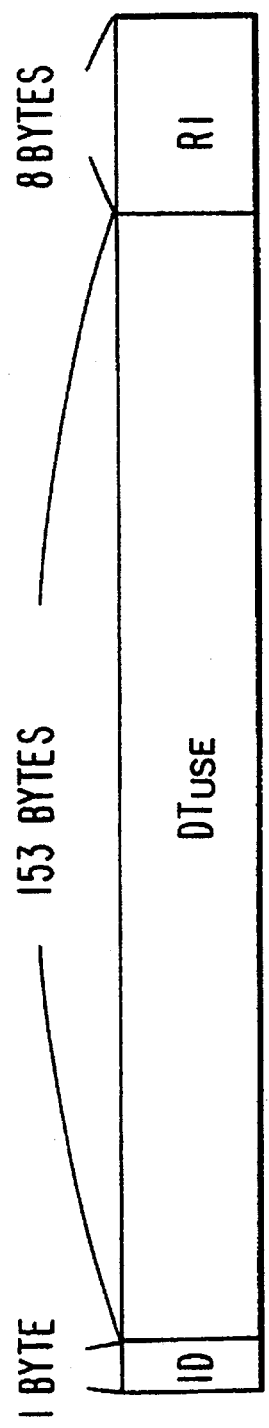
FIG. 6 is a schematic diagram showing an inner data block in the recording system of the data recorder.
Figure 5A:
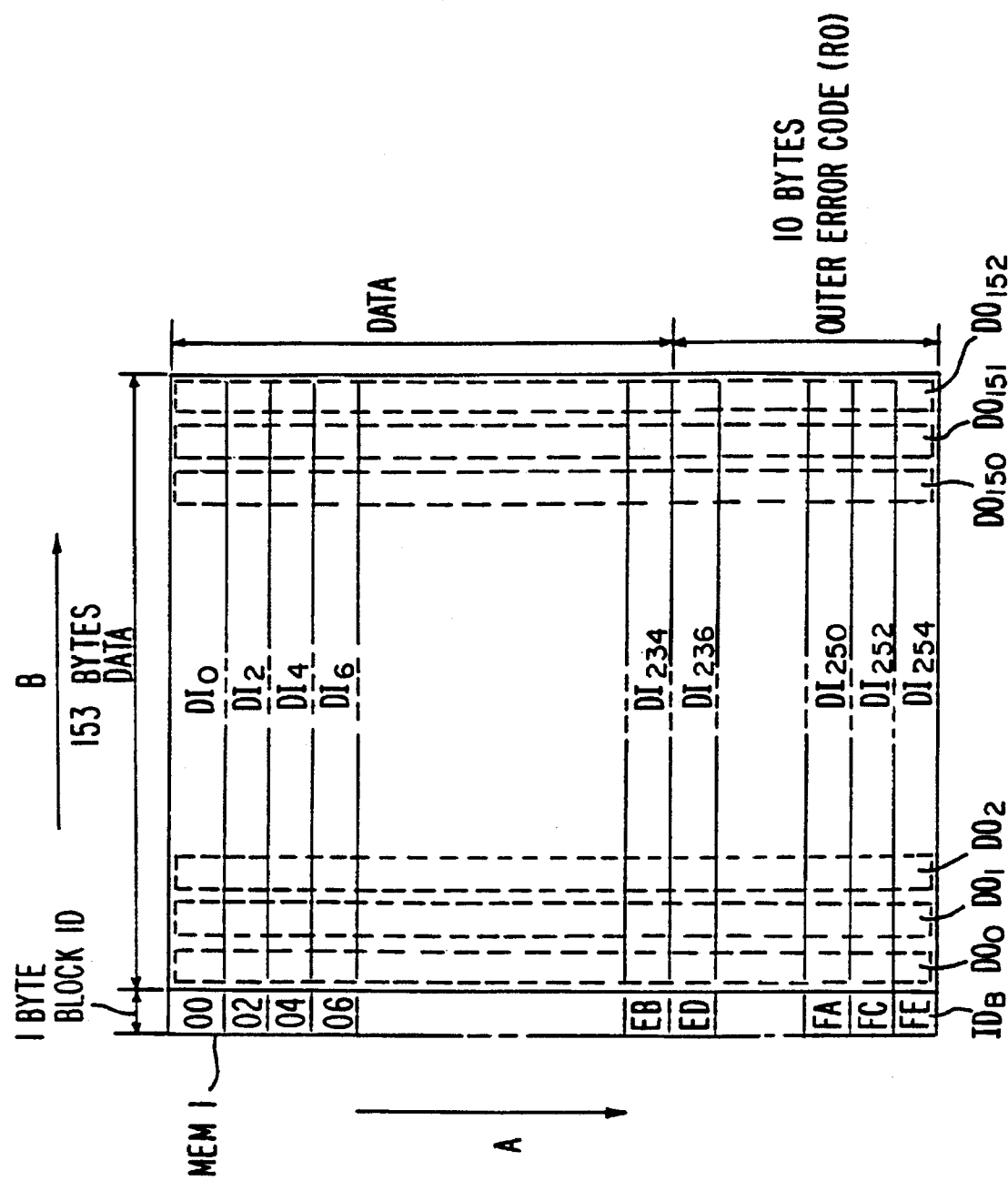
FIG. 5 is a schematic diagram showing the data arrangement in a memory in the recording system of the data recorder.
Figure 5B:
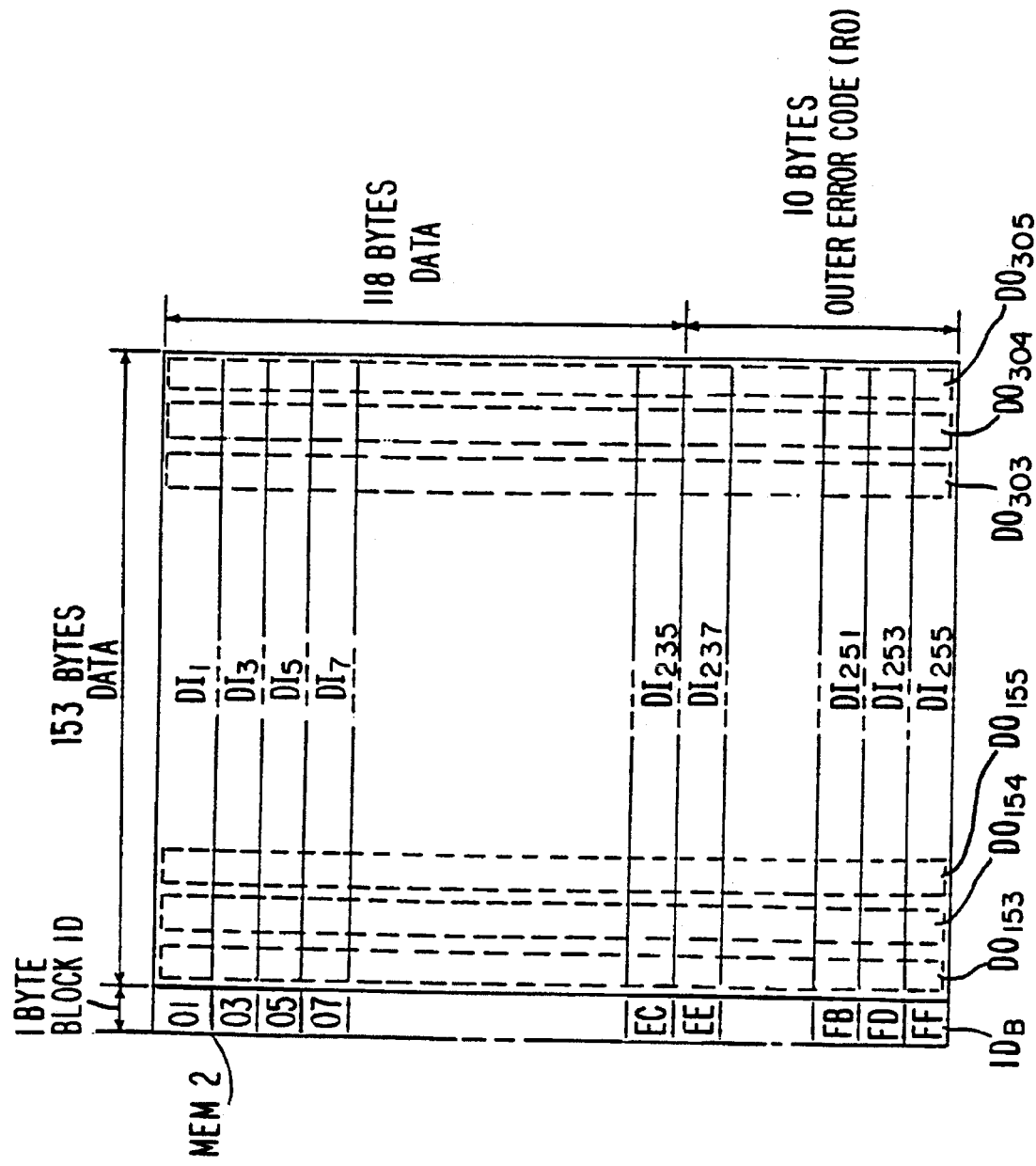
Figure 7B:
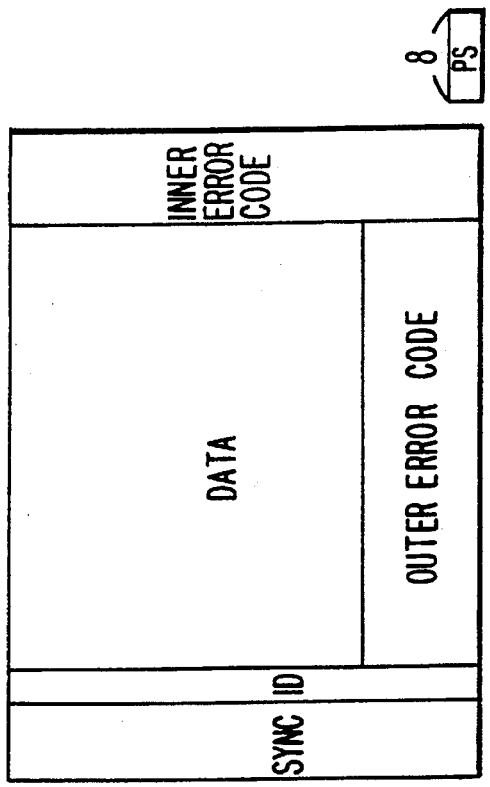
FIG. 7 is a schematic diagram showing the data in a map display.
Figure 7A:
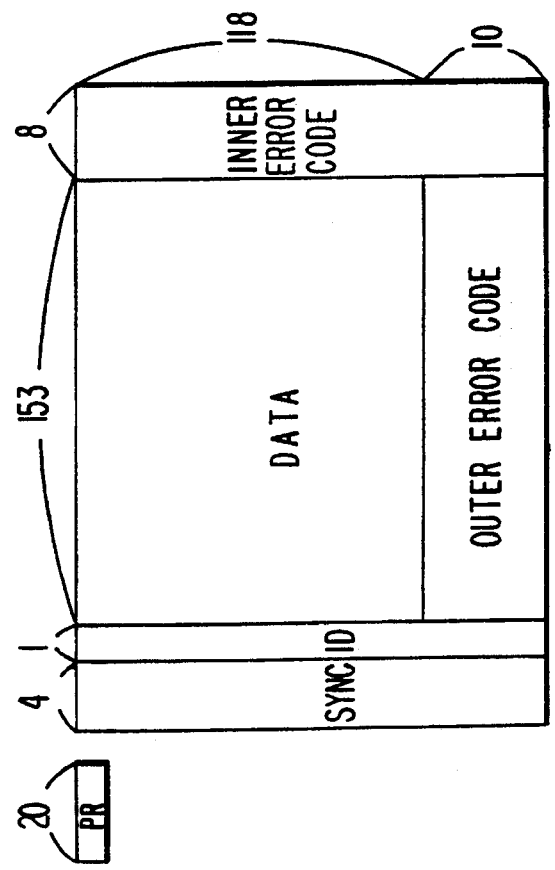
Figure 8:
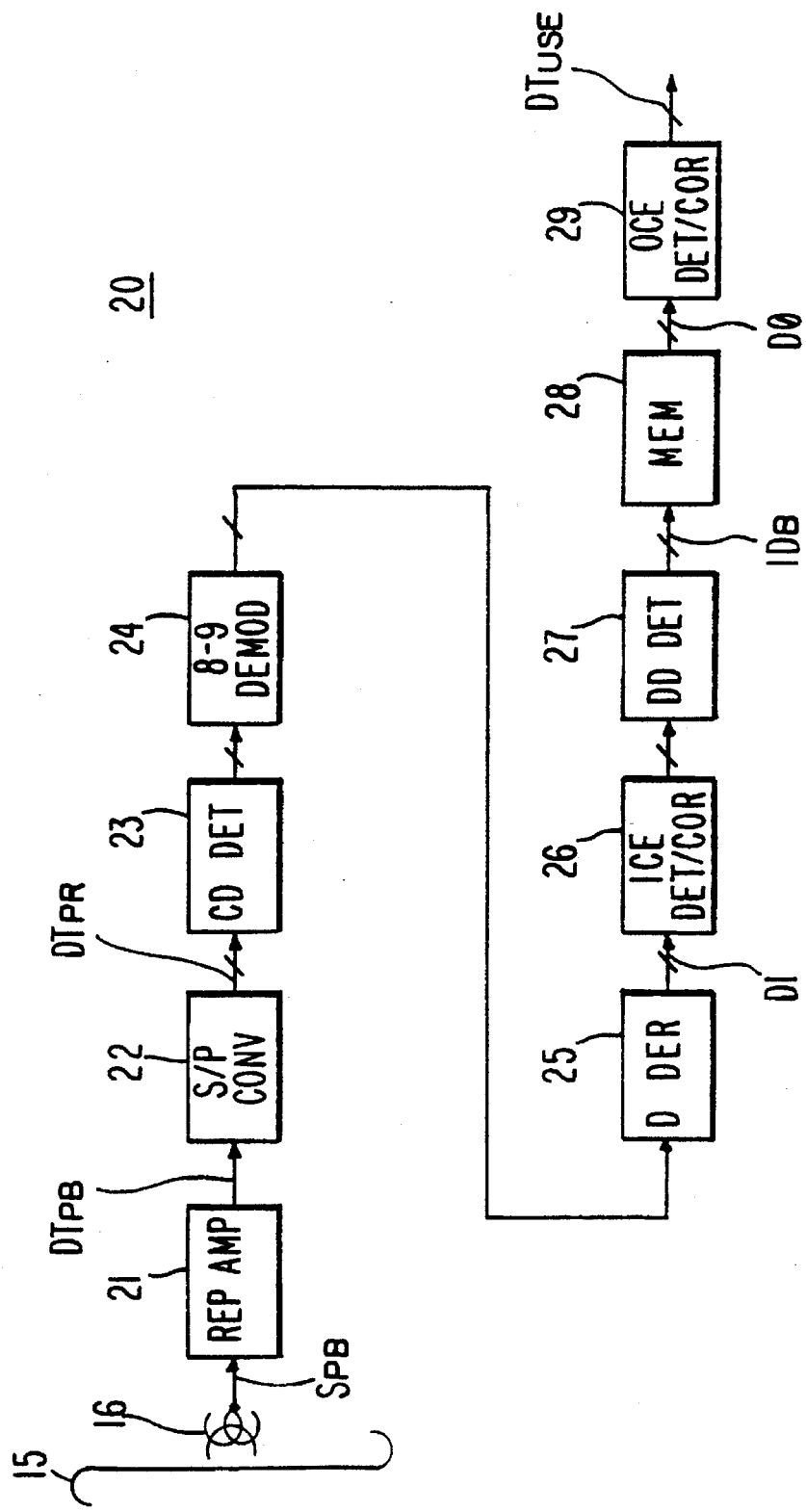
FIG. 8 is a block diagram showing a reproducing system of the ID-1 format data recorder.
Figure 9:
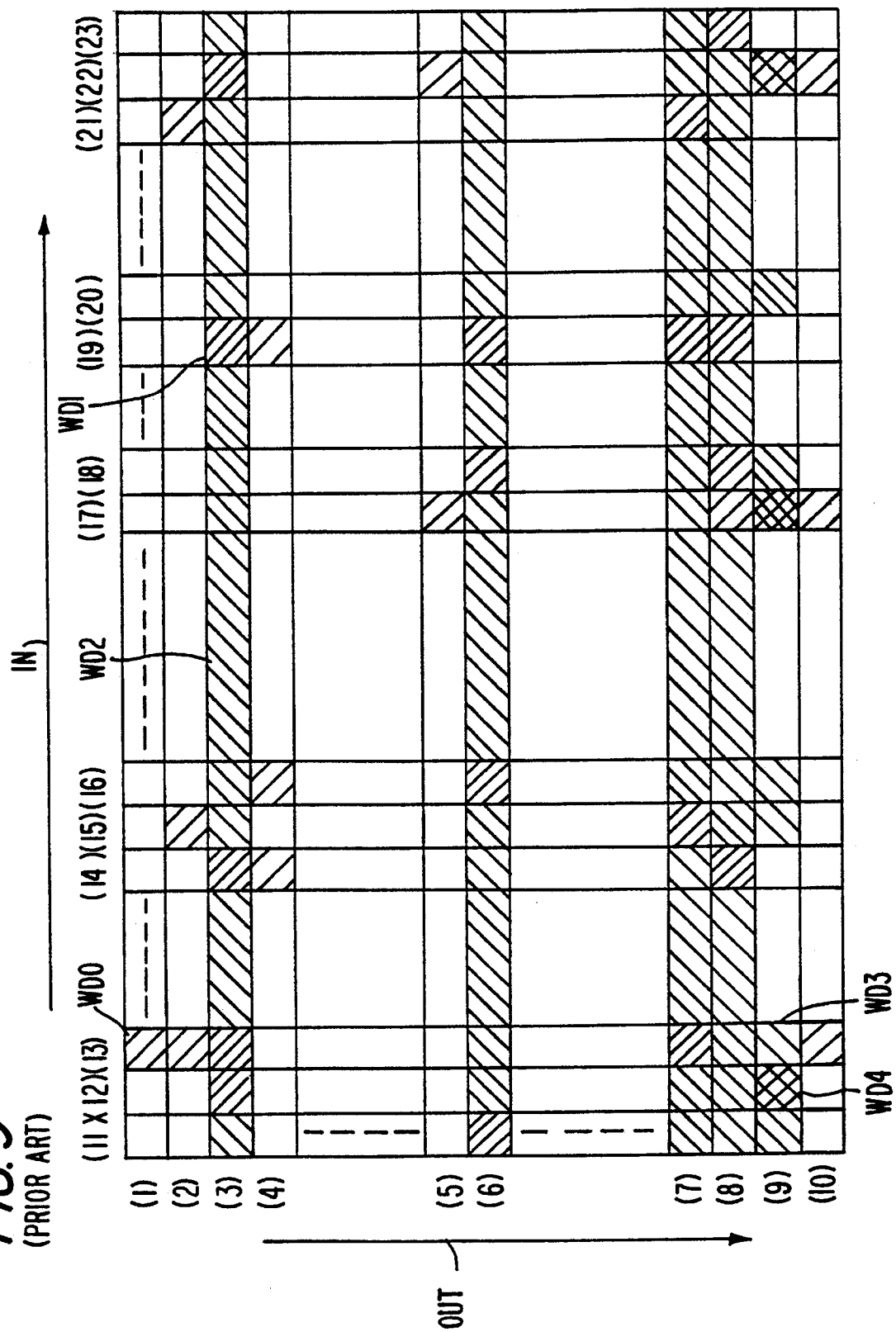
FIG. 9 is a schematic diagram explaining the correction of an inner error outer error.
Figure 12:
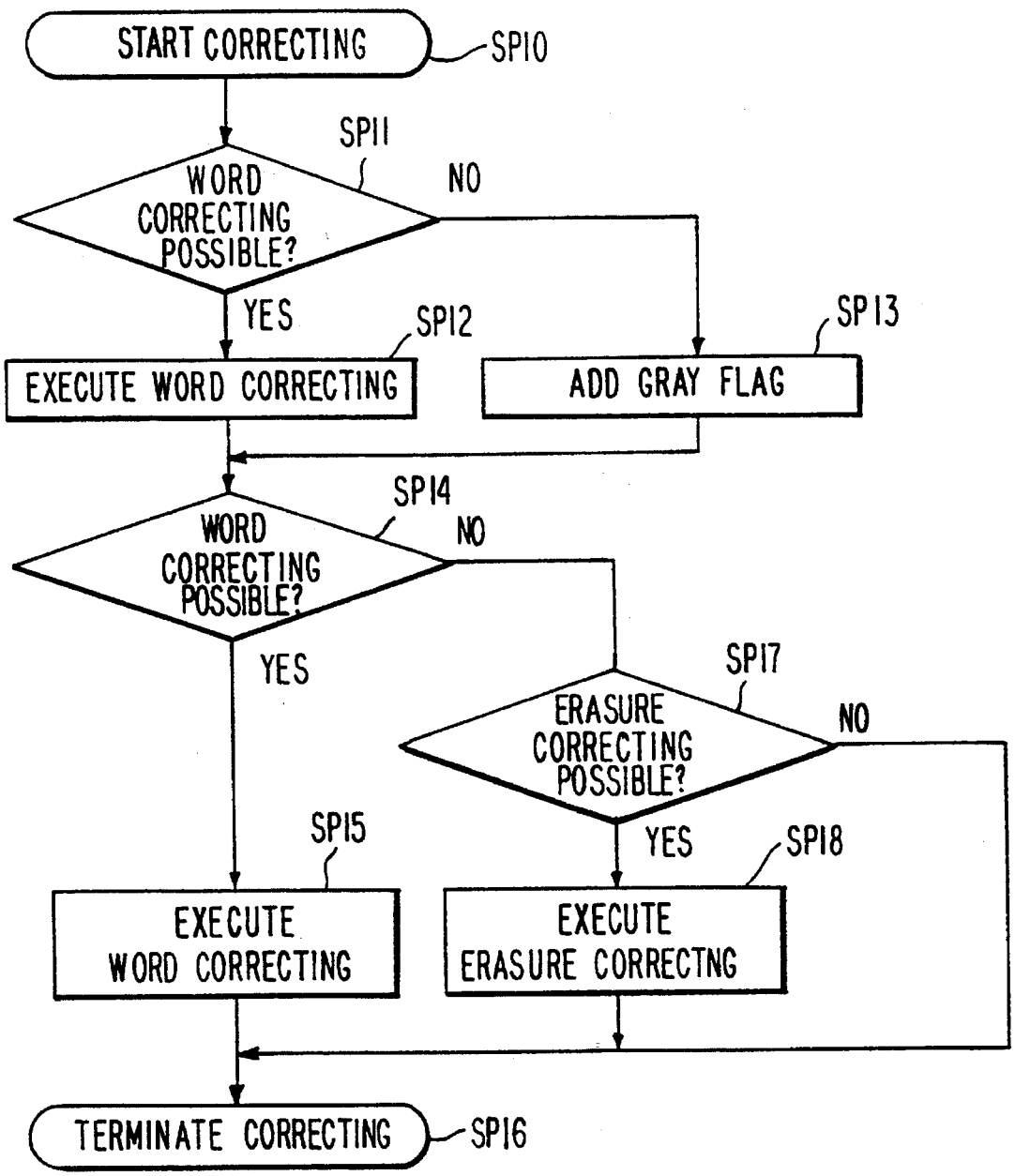
FIG. 12 is a flowchart showing the inner error outer error correcting procedure being an embodiment of the error correcting method according to present invention.

Preferred embodiments of the present invention will be described with reference to the accompanying drawings:

In an inner code error detecting and correcting circuit 26 and an outer code error detecting and correcting circuit 29 of a reproducing system of a data recorder such as shown in FIG. 8, according to the present invention the procedure of an inner error outer error correcting shown in FIG. 12 is executed, with respect to data in matrix shown in FIG. 9, to error correct. An 8-byte inner parity and a 10-byte outer parity are added at the coding side as the data.

Actually, referring to FIG. 12 the correction procedure is started at step SP10, and at the succeeding step SP11, errors up to 4-words at the inner side are judged whether the word correcting is possible or not. Here, if an affirmative result is obtained, the word correcting is executed at step SP12. Conversely, if a negative result is obtained at the step SP11, it proceeds to step SP13 to add a pray flag.

In either case, it proceeds to step SP14 to judge whether errors up to 5- words at the outer side can be word corrected or not. If an affirmative result is obtained, it proceeds to step SP15 to execute word correcting, and at step SP16, the above error correcting processing SP10 is terminated.

However, if a negative result is obtained at step SP14, errors up to 10-words are judged whether the erasure correcting is possible or not at step SP17. If an affirmative result is obtained, at step SP18, errors up to 10-words are erasure corrected, and it proceeds to step SP16 to terminate the above error correcting processing. Also, at step SP17, if a negative result is obtained, it proceeds to step SP16 to terminate the above error correcting processing SP10.

Thereby, in the matrix of FIG. 9, with respect to (1) through (10), (1), (2), (4), (5), and (10) can be corrected as inner correcting IN, similarly to the conventional procedure, since (1) is a 1-word error, (5) is a 2-words error, (2), (4), and (10) are 3-words errors. Since (6) and (7) are 4-words errors, and (3) and (8) are 5-words errors, these cannot be corrected, therefore, gray flags are added to them. Further, since (9) which is a 6-words error is misjudged as 3-words error, (9) is miscorrected.

Further, as outer correcting OUT, since (20), (21), and (23) are 1-word errors respectively, (11), (12), (14) to (17), and (22) are 2-words errors respectively, (13) and (18) are a 3-words errors, (19) is a 4-words error, these can be word corrected. While there were no data blocks with at least 5 words of error at the outer side in the matrix of FIG. 9, such a data block, if it existed in the present example, can be erasure corrected by using the flags.

Figure 10:
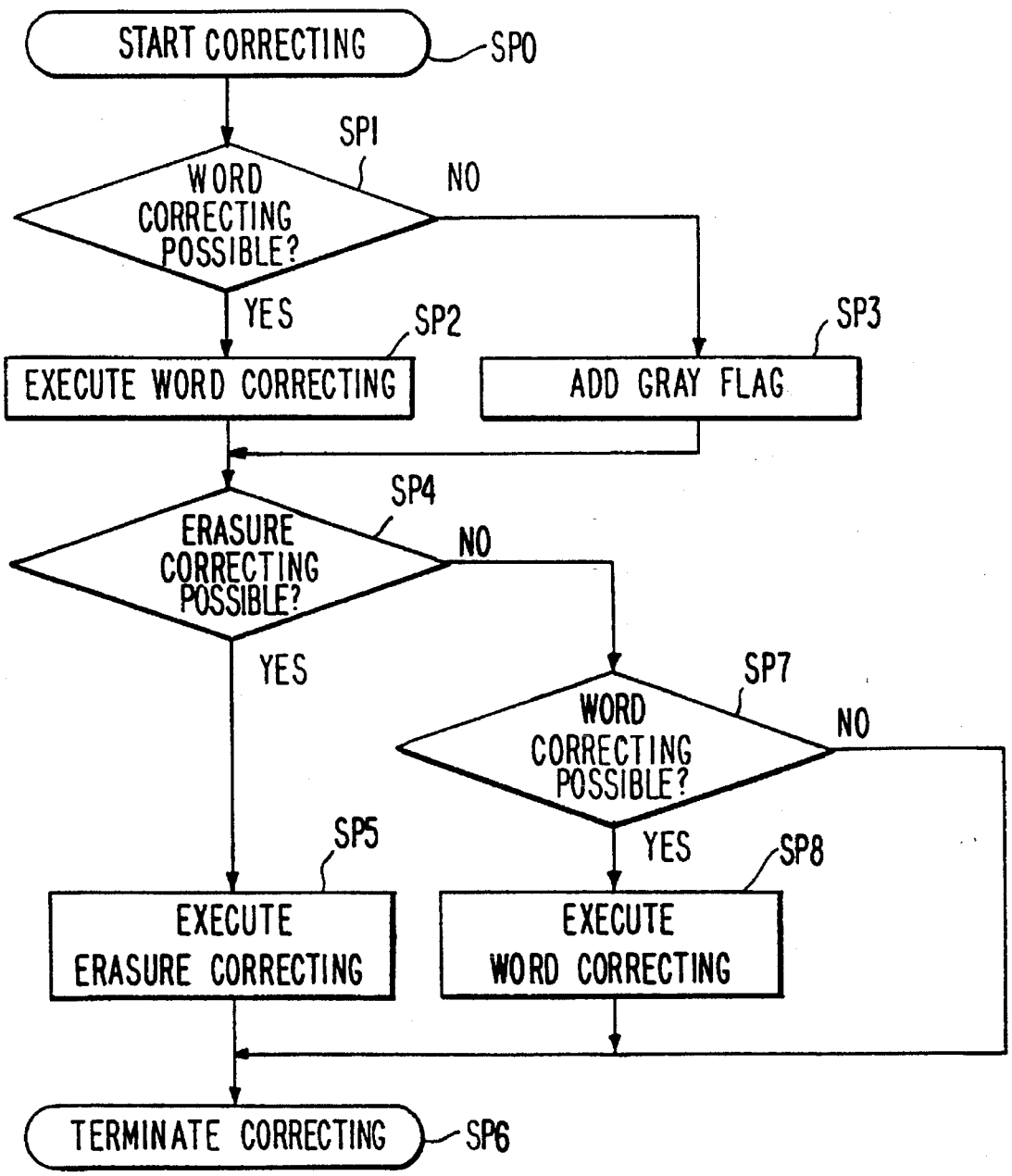
FIG. 10 is a flowchart showing a conventional inner error Outer error correcting procedure.
Figure 11:
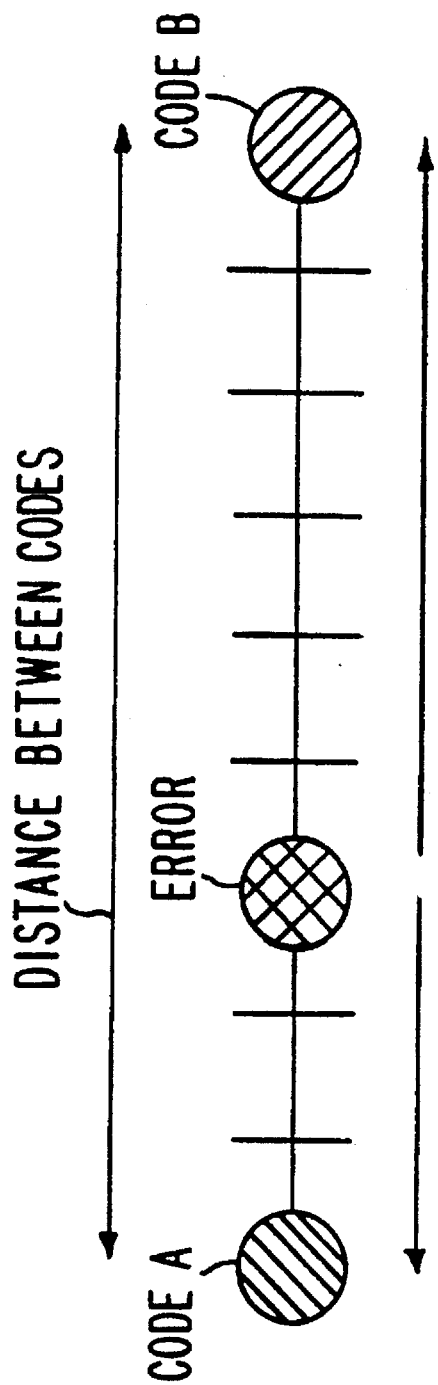
FIG. 11 is a schematic diagram explaining the generation of an erroneous correction due to erasure correction.

In this manner, when outer correcting, the word correcting is executed with high priority, and if the word correcting is impossible, the erasure correcting is executed by using the gray flag added at the inner side. Thereby, although the probability of erroneous correcting in outer correcting is $10^{-19}$ with respect to a symbol error rate $10^{-4}$ in the conventional algorithm shown in FIG. 10, in this embodiment, it can be improved drastically, i.e., to $10^{-50}$.

According to the above method, when decoding a data coded in a product coding form, word correcting is executed at the inner side while a flag is added to one which cannot be word corrected. Also, at the outer side, word correcting is executed while errors which cannot be word corrected are erasure corrected by using the flag. Thereby, an error correcting method can be realized wherein the probability of the occurrence of erroneous correction due to erasure correcting can be reduced drastically.

Note that, in the above embodiment, the error correcting is executed in decoding the data coded by product codes. However, this invention is not only limited to this, but may be applied to decoding data that have been added parity codes and coded.

In such a case, if errors up to half of a predetermined word number of the data are word corrected, and errors up to a predetermined word number of the data are erasure corrected, the probability of the occurrence of erroneous correction due to erasure correcting can be reduced.

Further, in the above embodiment, this invention is applied to the reproducing system of a data recorder. However, this invention is not only limited to this, but may be widely applied to various electronic devices that decode data that has been added parity codes for error correcting.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. An error correcting method comprising the steps of:
   dividing input information data into data blocks each of a predetermined number of words;
   generating outer and inner parity codes for error correcting said respective data blocks each of said predetermined number of words;
   adding said data blocks and said outer and inner parity codes to produce encoded data in the form of product codes of outer and inner data block; and
   decoding the encoded data by:
   first, word correcting an inner data block, if that is possible, and otherwise adding a gray flag to each word in said inner data block;

in either case, then word correcting an outer data block, if that is possible; and finally, only if word correcting said outer data block is not possible, erasure correcting said outer data block, if that is possible according to a number of gray flags added to respective words in said outer data block.

2. An error correcting method according to claim 1 wherein Reed-Solomon codes are added as said parity codes.

3. An error correcting method comprising the steps of:

dividing input information data into data blocks each of a predetermined number of words;

generating N-byte outer parity codes and M-byte inner parity codes for error correcting;

adding said outer N-byte parity codes at the outer side of said data blocks and said inner M-byte parity codes at the inner side of said data blocks to produce encoded data in the form of product codes of outer and inner data blocks; and p1 decoding the encoded data by:

first, word correcting an inner data block, if that is possible, and otherwise adding a gray flag to each word in said inner data block;

in either case, then word correcting an outer data block, if that is possible; and finally, only if word correcting said outer data block is not possible, erasure correcting said outer data block, if that is possible according to a number of gray flags added to respective words in said outer data block.

4. An error correcting method according to claim 3 wherein, Reed-Solomon codes are added as said parity codes.

* * * * *

UNITED STATES PATENT AND TRADEMARK OFFICE
CERTIFICATE OF CORRECTION

PATENT NO. : 5,608,740
DATED : March 04, 1997
INVENTOR(S) : Takashi Watanabe

Page 1 of 2

It is certified that error appears in the above-identified patent and that said Letters Patent is hereby corrected as shown below:

Col.1, line 20, delete "the" first occurrence
line 63, change "configurating" to --configuration--
line 66, change "an" to --a--
Col.2, line 12, change "$DO_0$to" to --$DO_0$ to--
Col.3, line 52, change "SpB" to --$S_{PB}$--
Col.4, line 5, change 8-9demodulating" to --8-9 demodulating--
line 63, after "correcting" insert --,--
line 64, after "(1) " delete ","
Col.7, line 23, after "inner error" insert --/--.
line 24, after "error" insert --/--.
line 25, change "Outer" to --outer--
line 27, after ";" insert --and--
line 28, after "inner error" insert --/--
line 36, change ":" to --.--
line 41, after "inner error" insert --/--
line 51, change "pray" to --gray--
Col.8, line 10, delete "a"
line 21, after "rate" insert --of--

UNITED STATES PATENT AND TRADEMARK OFFICE
CERTIFICATE OF CORRECTION

PATENT NO. : 5,608,740
DATED : March 04, 1997
INVENTOR(S) : Takashi Watanabe

It is certified that error appears in the above-identified patent and that said Letters Patent is hereby corrected as shown below:

Col.9, line 8, after "wherein" insert --,--
Col.10, line 3, delete "p1"

Signed and Sealed this

Tenth Day of March, 1998

Attest:

BRUCE LEHMAN

Attesting Officer   Commissioner of Patents and Trademarks